United States Patent [19]
Miyazawa

[11] Patent Number: 5,812,354
[45] Date of Patent: Sep. 22, 1998

[54] SEMICONDUCTOR INTEGRATED CIRCUIT DEVICE HAVING SUBSTRATE POTENTIAL DETECTING CIRCUIT LESS DAMAGED BY STATIC CHARGE PROPAGATED THERETO THROUGH SHARED CONDUCTIVE LINE

[75] Inventor: Makoto Miyazawa, Kanagawa, Japan

[73] Assignee: NEC Corporation, Tokyo, Japan

[21] Appl. No.: 838,037

[22] Filed: Apr. 22, 1997

[30] Foreign Application Priority Data

Apr. 25, 1996 [JP] Japan .................................. 8-105249

[51] Int. Cl.⁶ .................................................. H02H 3/20
[52] U.S. Cl. ........................................... 361/91; 327/535
[58] Field of Search ................................ 361/18, 56, 91, 361/111; 327/77, 80, 530, 534, 535, 537, 538, 542, 543, 545

[56] References Cited

U.S. PATENT DOCUMENTS

| | | | |
|---|---|---|---|
| 4,691,287 | 9/1987 | Suzuki et al. | 364/490 |
| 4,733,285 | 3/1988 | Ishioka et al. | 257/23.13 |
| 4,833,650 | 5/1989 | Hirayama et al. | 365/225.7 |
| 4,951,254 | 8/1990 | Ontrop et al. | 365/201 |
| 4,970,727 | 11/1990 | Miyawaki et al. | 371/21.3 |
| 5,315,166 | 5/1994 | Arimoto | 327/535 |
| 5,379,174 | 1/1995 | Kasamoto | 361/56 |
| 5,659,550 | 8/1997 | Mehrotra et al. | 371/21.4 |

FOREIGN PATENT DOCUMENTS

| | | | |
|---|---|---|---|
| 0 144 680 | 6/1985 | European Pat. Off. | H01L 23/54 |
| 0 317 014 | 5/1989 | European Pat. Off. | G11C 29/00 |

*Primary Examiner*—Ronald W. Leja
*Attorney, Agent, or Firm*—Young & Thompson

[57] ABSTRACT

A semiconductor integrated circuit device communicates with an external device through signal terminals, and is powered through power terminals; protective circuits are respectively connected to the signal terminals for discharging static electric charge through a shared conductive line to the power terminal connected to a ground line, and a potential level of the semiconductor substrate is propagated through the shared conductive line to a detecting circuit for reversely biasing the semiconductor substrate at intervals; and an interrupting circuit discriminates isolating state of the power terminal from the ground line so as to cut off a current path between the shared conductive line and the detecting circuit.

4 Claims, 3 Drawing Sheets

5,812,354

SEMICONDUCTOR INTEGRATED CIRCUIT DEVICE HAVING SUBSTRATE POTENTIAL DETECTING CIRCUIT LESS DAMAGED BY STATIC CHARGE PROPAGATED THERETO THROUGH SHARED CONDUCTIVE LINE

FIELD OF THE INVENTION

This invention relates to a semiconductor integrated circuit device and, more particularly, to a semiconductor integrated circuit device having a potential detecting circuit for a substrate less damaged by static electric charge.

DESCRIPTION OF THE RELATED ART

A semiconductor integrated circuit device usually has a signal line coupled to a plurality of field effect transistors. A typical example of the signal line is a word line incorporated in a semiconductor memory device, and is usually connected to the gate electrodes of many field effect transistors forming parts of a row of memory cells. Parasitic capacitors are respectively coupled to the gate electrodes, and retard the signal propagated through the word line. When the semiconductor substrate is reversely biased, the parasitic capacitance is decreased, and, accordingly, the signal propagation is accelerated.

A substrate bias circuit is incorporated in the semiconductor integrated circuit device so as to reversely bias the semiconductor substrate. However, the reverse bias consumes a non-ignoreable amount of electric power, and, for this reason, the substrate bias circuit stands idle until a predetermined bias level except for a data-access or a data write-in. This means that the substrate bias circuit requires a potential detecting circuit. The potential detecting circuit is connected through a potential line to the semiconductor substrate.

The integrated circuit communicates with external devices through signal pins, and is powered through a power supply pin and a ground pin. These pins project from a package, and are liable to be exposed to a static electric source. The static electric charge damages circuit components of the integrated circuit, and a protective circuit is usually provided between the pins and those circuit components. When static electric charge is applied to the pin, the protective circuit discharges the excessively high potential level through a discharging line.

Thus, the integrated circuit is accompanied with the potential detecting circuit and the protective circuit, and a conductive line is usually shared between the potential line for the potential detecting circuit and the discharging line for the protective circuit, because the potential line and the discharging line occupy wide real estate of the semiconductor substrate.

FIG. 1 illustrates a typical example of the semiconductor integrated circuit device of the type having the shared conductive line. The prior art semiconductor integrated circuit device is fabricated on a p-type semiconductor substrate 1, and a main electric circuit 2a is incorporated in the integrated circuit. The main electric circuit 2a is connected to signal input/output terminals 3a and power supply terminals 3b, and is powered so as to process input signals supplied from the signal input/output terminals 3a. Only one of the signal input/output terminals 3a and the power supply terminal 3b for the ground potential are shown in FIG. 1, and the power supply terminal 3b is connected to a ground line GND.

The signal input/output terminal and the power supply terminal 3a/3b are further connected to protective circuits 2b and 2c, respectively. The protective circuit 2b is implemented by a parallel combination of an n-p-n type bipolar transistor BT1 and a parasitic diode D1, and the signal input/output terminal 3a is connected to the collector node of the n-p-n type bipolar transistor BT1 and the cathode of the parasitic diode D1. The base node of the n-p-n bipolar transistor BT1 is connected to the anode of the parasitic diode D1. When static electric charge is applied to the signal input/output terminal 3a, the potential level at the signal input/output terminal 3a exceeds over the breakdown voltage of the parasitic diode D1, and the parasitic diode D1 allows the static electric charge to pass therethrough, and the static electric charge causes the n-p-n type bipolar transistor BT1 to turn on.

Similarly, the protective circuit 2c is implemented by a parallel combination of an n-p-n type bipolar transistor BT2 and a diode D2, and the power supply terminal 3b is connected to the collector node of the n-p-n type bipolar transistor BT2 and the cathode of the diode D2. The anode of the parasitic diode D1 is connected through a shared conductive line Lsb to the anode of the diode, and the static electric charge or current I1 is discharged from the n-p-n type bipolar transistor BT1 through the shared conductive line Lsb, the diode D2 and the power supply terminal 3b to the ground line GND. The shared conductive line Lsb is desirable, because only a small amount of real estate is occupied by the shared conductive line Lsb.

A potential detecting circuit 2d is further incorporated in the integrated circuit, and is implemented by a p-channel enhancement type switching transistor MT1. The p-channel enhancement type switching transistor MT1 has a gate electrode connected to the shared conductive line Lsb, and the source-to-drain path is connected between the power supply terminal 3b and the main electric circuit 2a.

The potential level of the p-type semiconductor substrate 1 is propagated through the shared conductive line Lsb to the gate electrode of the p-channel enhancement type switching transistor MT1, and the p-channel enhancement type switching transistor MT1 is responsive to a negative potential level of the p-type semiconductor substrate 1 so as to supply a detecting signal S1 to the main electric circuit 2a.

Thus, the potential detecting circuit 2d shares the conductive line Lsb with the protective circuits 2b/2c.

FIG. 2 illustrates the layout of the protective circuit 2b/2c and the potential detecting circuit 2d on the p-type semiconductor substrate 1, and the cross section along line A—A is shown in FIG. 3.

N-type impurity regions 1a and 1b and a heavily doped p-type impurity region 1c are formed in a surface portion assigned to the protective circuit 2b at intervals. The first n-type impurity region 1a serves as the emitter region of the n-p-n type bipolar transistor BT1, and the second n-type impurity region 1b is shared between the collector region of the n-p-n type bipolar transistor BT1 and the cathode of the parasitic diode D1. The heavily doped p-type impurity region 1c serves as an anode contact region of the parasitic diode D1. The first n-type impurity region 1a, the p-type semiconductor substrate 1 and the second n-type impurity region 1b as a whole constitute the n-p-n type bipolar transistor BT1, and the second n-type impurity region 1b and the p-type semiconductor substrate 1 form in combination the parasitic diode D1.

N-type impurity regions 1d/1e and a heavily doped p-type impurity region 1f are similarly formed in another surface portion assigned to the protective circuit 2c, and the heavily doped p-type impurity region 1f serves as the anode contact region of the diode D2. The n-type impurity region 1d, the p-type semiconductor substrate 1 and the n-type impurity region 1e as a whole constitute the bipolar transistor BT2, and the n-type impurity region 1e and the p-type semiconductor substrate 1 form in combination the diode D2.

An n-type well 1g is formed between the surface portion assigned to the protective circuit 2b and the surface portion assigned to the other protective circuit 2c, and p-type impurity regions 1h/1i are formed in the n-type well 1g on both sides of a channel region. The channel region is covered with a gate oxide layer 2da, and the gate oxide layer 2da is overlain by an electrode 2db of polysilicon. The periphery of the n-type well 1g is deleted from the layout shown in FIG. 2.

The major surface of the p-type semiconductor substrate 1 is covered with an insulating layer 3, and the shared conductive line Lsb, the signal input/output terminal 3a and the power supply terminal 3b are formed of metal on the insulating layer 3.

The prior art semiconductor integrated circuit device encounters a problem in that the gate oxide layer 2da is still damaged due to static electric charge.

SUMMARY OF THE INVENTION

It is therefore an important object of the present invention to provide a semiconductor integrated circuit device a potential detecting circuit of which is less liable to be damaged without increase of a real estate.

The present inventor contemplated the problem, and noticed that the damage was liable to take place during a fabrication process of the semiconductor integrated circuit device such as an assembling process or a marking process. While the semiconductor integrated circuit device is being assembled or marked, the power supply terminals 3b were isolated from a power source and the ground line GND, and current I3 was not discharged. The present inventor concluded that current I2 damaged the gate oxide layer 2da.

To accomplish the object, the present invention proposes to cut off a current path from a shared conductive line to a detecting circuit which a semiconductor integrated circuit device is isolated from electric power sources.

In accordance with the present invention, there is provided a semiconductor integrated circuit device fabricated on a semiconductor substrate, comprising: a main electric circuit; at least one first terminal assigned to an electric signal swinging a potential level thereof within a certain potential range, and supplying the electric signal to the main electric circuit; at least one second terminal assigned to a power voltage so as to supply the power voltage to the main electric circuit; a first protective circuit connected to the at least one first terminal, and turned off in so far as the at least one first terminal swings a potential level thereof within the certain potential range; a second protective circuit connected to the at least one second terminal, and allowing an electric current to flow into the at least one second terminal; a detecting circuit monitoring a potential level of the semiconductor substrate, and supplying a detecting signal to the main electric circuit when the potential level of the semiconductor substrate reaches a certain value; a conductive line shared between the first protective circuit, the second protective circuit and the detecting circuit, and propagating an excess potential level from the first protective circuit to the second protective circuit and the potential level of the semiconductor substrate to the detecting circuit; and an interrupting circuit connected between the conductive line and the detecting circuit, and discriminating a safety condition for transferring the potential level of the semiconductor substrate through a current path thereof to the detecting circuit, and the interrupting circuit further discriminates a dangerous condition so as to cut off the current path between the conductive line and the detecting circuit.

BRIEF DESCRIPTION OF THE DRAWINGS

The features and advantages of the semiconductor device according to the present invention will be more clearly understood from the following description taken in conjunction with the accompanying drawings in which.

DESCRIPTION OF THE PREFERRED EMBODIMENT

Figure 1:
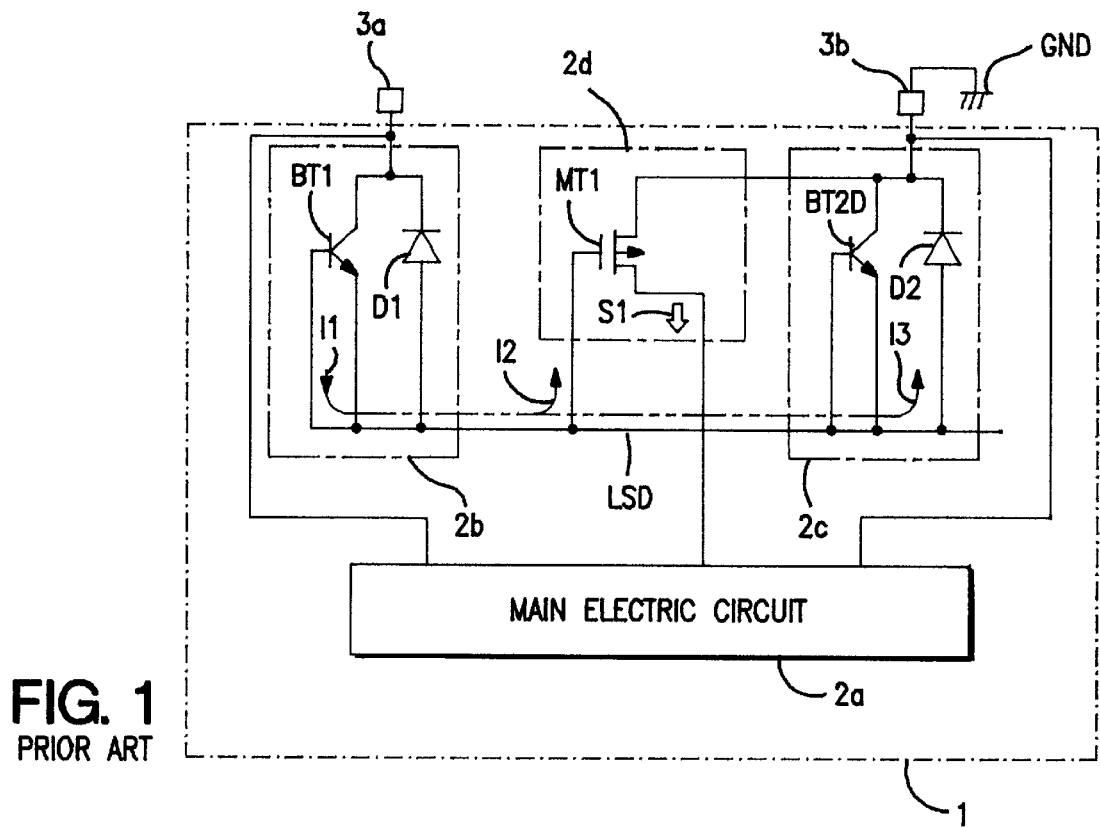
FIG. 1 is a circuit diagram showing the arrangement of the prior art semiconductor integrated circuit device.
Figure 4:
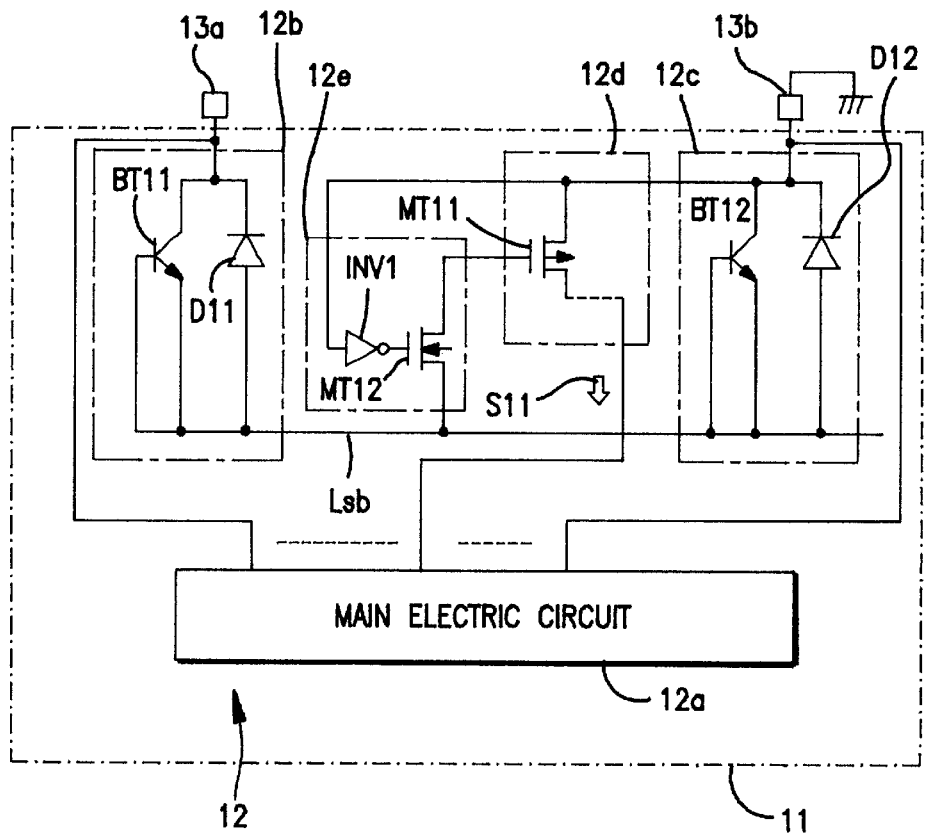
FIG. 4 is a circuit diagram showing the arrangement of a semiconductor integrated circuit device according to the present invention.
Figure 2:
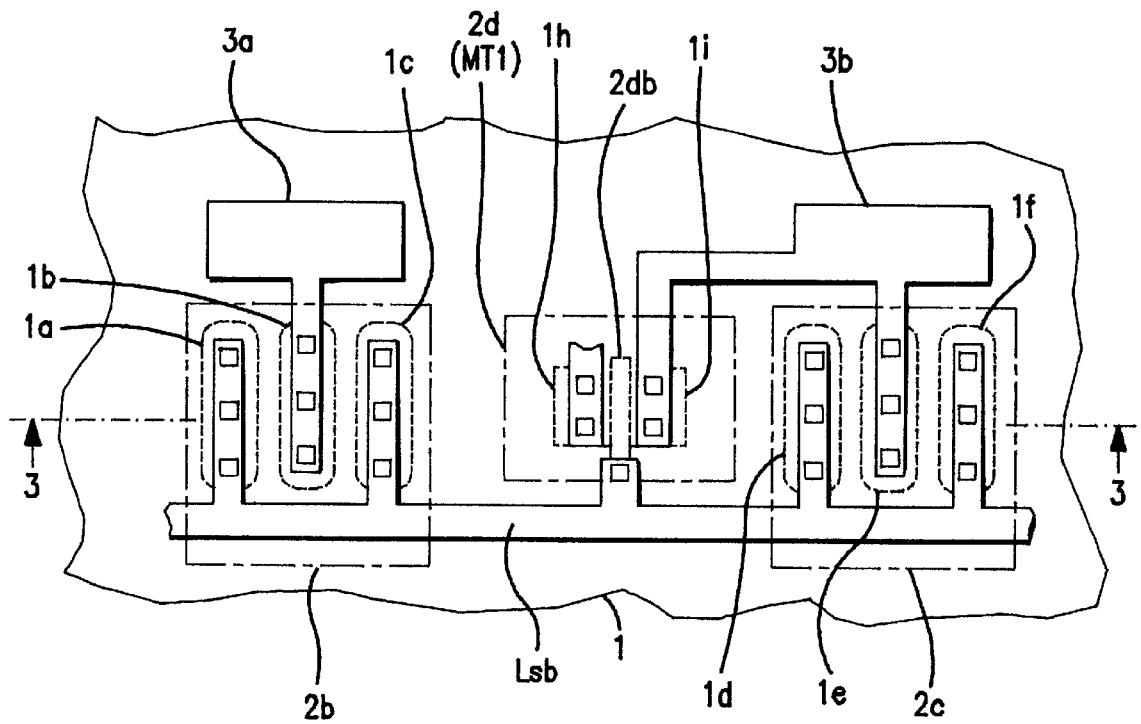
FIG. 2 is a plan view showing the layout of the essential part of the prior art semiconductor integrated circuit device.
Figure 3:
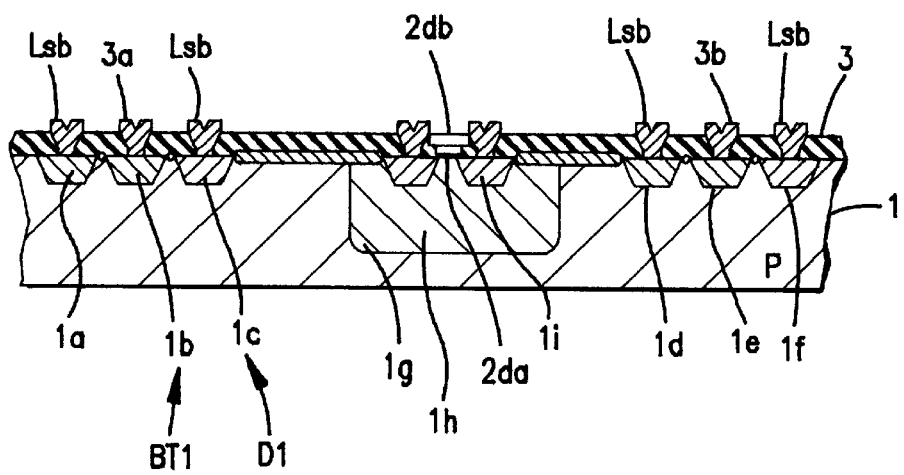
FIG. 3 is a cross sectional view taken along line A—A of FIG. 2 and showing the structure of the prior art semiconductor integrated circuit device.

Referring to FIG. 4 of the drawings, a semiconductor integrated circuit device embodying the present invention is fabricated on a p-type semiconductor substrate 11, and a main electric circuit 12a is incorporated in an integrated circuit 12. The main electric circuit 12a is connected to signal input/output terminals 13a and power supply terminals 13b, and power the integrated circuit 12 so as to process input signals supplied from the signal input/output terminals 13a. The signal input/output terminal 13a accepts an electric signal swinging its potential level within a certain range. Only one of the signal input/output terminals 13a and the power supply terminal 13b for the ground potential are shown in FIG. 4, and the power supply terminal 13b is connected to a ground line GND.

The signal input/output terminal and the power supply terminal 13a/13b are further connected to protective circuits 12b and 12c, respectively. The protective circuit 12b is implemented by a parallel combination of an n-p-n type bipolar transistor BT11 and a parasitic diode D11, and the signal input/output terminal 13a is connected to the collector node of the n-p-n type bipolar transistor BT11 and the cathode of the parasitic diode D11. The base node of the n-p-n bipolar transistor BT11 is connected to the anode of the parasitic diode D11. The emitter node of the n-p-n type bipolar transistor BT11 and the anode of the parasitic diode D11 are connected to a shared conductive line Lsb.

When static electric charge outside of the certain range is applied to the signal input/output terminal 13a, the potential level at the signal input/output terminal 13a exceeds over the breakdown voltage of the parasitic diode D11, and the parasitic diode D11 allows the static electric charge to pass therethrough. The static electric charge is propagated to the base node of the n-p-n type bipolar transistor BT11, and causes the n-p-n type bipolar transistor BT11 to turn on. The n-p-n type bipolar transistor BT11 bursts out into the shared conductive line Lsb.

The protective circuit 12c is implemented by a parallel combination of an n-p-n type bipolar transistor BT12 and a diode D12, and the power supply terminal 13b is connected to the collector node of the n-p-n type bipolar transistor BT12 and the cathode of the diode D12. The anode of the parasitic diode D12, the base node/the emitter node of the n-p-n type bipolar transistor BT12 are connected to the shared conductive line Lsb. Thus, the protective circuits 13a and 13b are connected through the shared conductive line Lsb to each other, and the shared conductive line Lsb occupies a small amount of real estate. The static electric charge is discharged from the n-p-n type bipolar transistor BT11 through the shared conductive line Lsb to the diode D12, and the diode D12 in turn discharges the static charge through the power supply terminal 13b to the ground line GND.

A potential detecting circuit 12d is further incorporated in the integrated circuit 12, and is implemented by a p-channel enhancement type switching transistor MT11. The p-channel enhancement type switching transistor MT11 has a gate electrode connectable to the shared conductive line Lsb, and the source-to-drain path is connected between the power supply terminal 13b and the main electric circuit 12a. The detecting circuit 12d monitors the potential level of the p-type semiconductor substrate 11, and the p-channel enhancement type switching transistor MT11 turns on so as to supply a detecting signal S11 to the main electric circuit 12a when the potential level becomes a predetermined negative level.

An interrupting circuit 12e is further incorporated in the integrated circuit 12, and has an inverter INV1 and an n-channel enhancement type switching transistor MT12. The inverter INV1 has an input node connected to the power supply terminal 13b, and the output node of the inverter INV1 is connected to the gate electrode of the n-channel enhancement type switching transistor MT12. The shared conductive line Lsb is connectable through the source-to-drain path of the n-channel enhancement type switching transistor MT12 to the gate electrode of the p-channel enhancement type switching transistor MT11.

While the semiconductor integrated circuit device is being powered through the power supply terminals 13b, the inverter INV1 supplies a positive potential to the gate electrode of the n-channel enhancement type switching transistor MT12, and the p-type semiconductor substrate 11 and, accordingly, the shared conductive line Lsb range between the negative potential level and the ground level. In this bias condition, the n-channel enhancement type switching transistor MT12 is turned on, and the shared conductive line Lsb is electrically connected to the gate electrode of the p-channel enhancement type switching transistor MT11. Thus, the interrupting circuit 12e allows the detecting circuit 12d to monitor the potential level of the p-type semiconductor substrate 11.

On the other hand, if the power voltages are removed from the semiconductor integrated circuit device, the inverter INV1 never supplies the positive potential level to the gate electrode of the n-channel enhancement type switching transistor MT12, and the conductive channel does not take place between the source region and the drain region. In other words, the p-channel enhancement type switching transistor MT11 is electrically isolated from the shared conductive line Lsb. In this situation, even if static electric charge is discharged from the signal input/output terminal 13a through the protective circuit 12b to the shared conductive line Lsb, the static electric charge does not reach the gate electrode of the p-channel enhancement type switching transistor MT11, and the gate insulating layer of the p-channel enhancement type switching transistor MT11 is never damaged.

The power supply terminals 13b are isolated from power voltage sources during an assembling stage and a marking stage in a fabrication process of the semiconductor integrated circuit device, and the gate insulating layer is protected against static electric charge.

Figure 5:
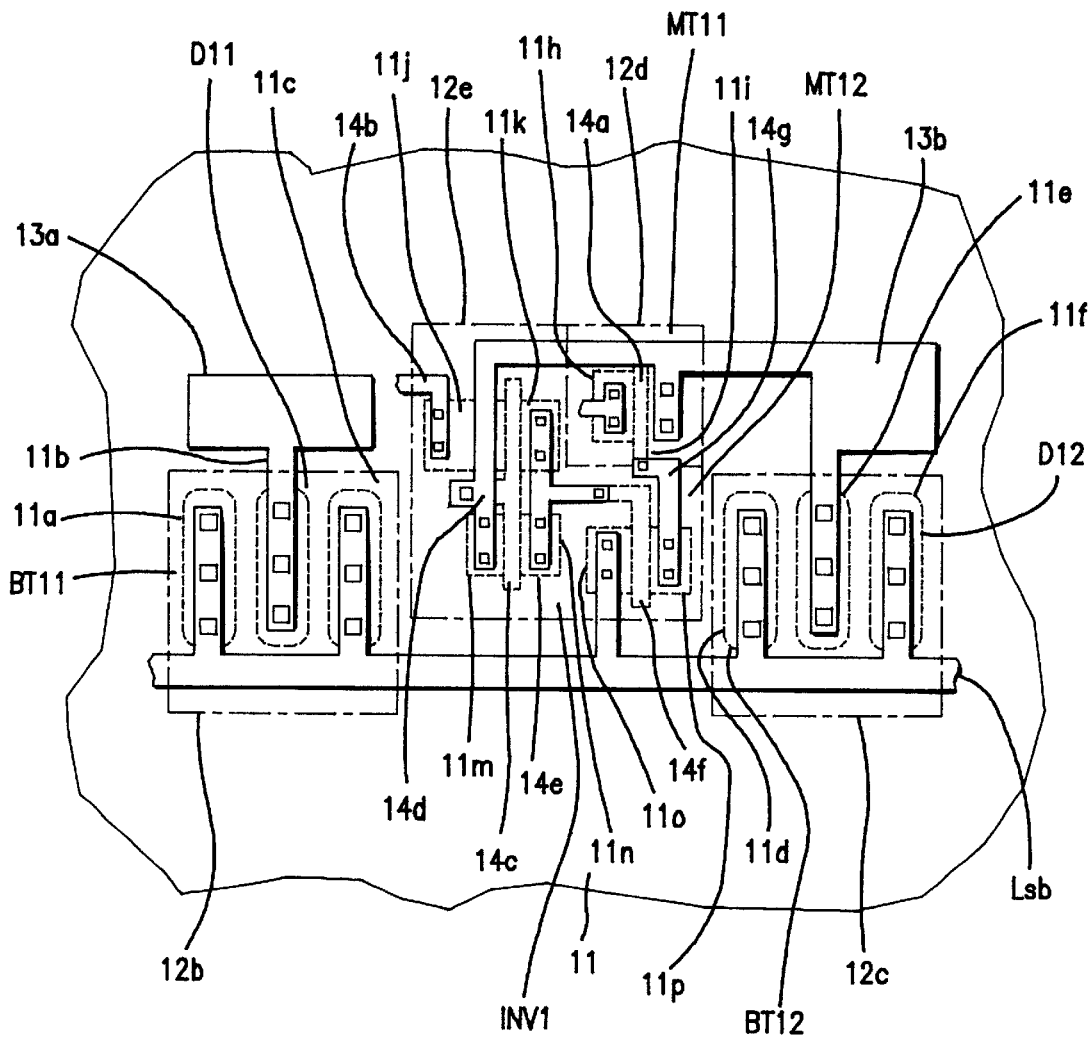
FIG. 5 is a plan view showing the layout of an essential part of the semiconductor integrated circuit device.

The protective circuits 12b/12c, the detecting circuit 12d and the interrupting circuit 12e are arranged on the major surface of the p-type semiconductor substrate 11 as shown in FIG. 5.

N-type impurity regions 11a and 11b and a heavily doped p-type impurity region 11c are formed in a surface portion assigned to the protective circuit 12b at intervals. The first n-type impurity region 11a serves as the emitter region of the n-p-n type bipolar transistor BT11, and the second n-type impurity region 11b is shared between the collector region of the n-p-n type bipolar transistor BT11 and the cathode of the parasitic diode D11. The heavily doped p-type impurity region 11c serves as an anode contact region of the parasitic diode D1. The first n-type impurity region 11a, the p-type semiconductor substrate 11 and the second n-type impurity region 11b as a whole constitute the n-p-n type bipolar transistor BT11, and the second n-type impurity region 11b and the p-type semiconductor substrate 11 form in combination the parasitic diode D11.

N-type impurity regions 11d/11e and a heavily doped p-type impurity region 11f are similarly formed in another surface portion assigned to the protective circuit 12c, and the heavily doped p-type impurity region 11f serves as the anode contact region of the diode D12. The n-type impurity region 11d, the p-type semiconductor substrate 11 and the n-type impurity region 11e as a whole constitute the bipolar transistor BT12, and the n-type impurity region 11e and the p-type semiconductor substrate 11 form in combination the diode D12.

The potential level of the p-type semiconductor substrate 11 is propagated through the heavily doped p-type impurity regions 11c/11f to the shared conductive line Lsb, and is transferred through the interrupting circuit 12e to the detecting circuit 12d.

An n-type well (not shown) is formed between the surface portion assigned to the protective circuit 12b and the surface portion assigned to the other protective circuit 12c, and is closer to the surface portion assigned to the protective circuit 12c. P-type impurity regions 11h/11i are formed in the n-type well on both sides of a channel region. The channel region is covered with a gate insulating layer (not shown), and the gate insulating layer is overlain by an electrode 14a of polysilicon.

Yet another surface portion is assigned to the interrupting circuit 12e, and an n-type well (not shown) is formed on the left side of the n-type well for the p-channel enhancement type switching transistor MT11. A p-type source region 11j and a p-type drain region 11k are formed in the n-type well, and is spaced from each other by a channel region. A positive power voltage line 14b is connected to the p-type source region 11j, and a common gate electrode 14c is formed on a gate insulating layer over the channel region. The p-type source region 11j, the p-type drain region 11k, the gate insulating layer and the common gate electrode 14c as a whole constitute a p-channel enhancement type field effect transistor forming a part of the inverter INV1.

An n-type source region 11m and an n-type drain region 11n are formed in the surface portion assigned to the interrupting circuit 12e, and are spaced from each other by a channel region covered with a gate insulating layer (not shown). The common gate electrode 14c extends on the gate insulating layer, and a ground line 14d is connected between the power supply terminal 13b for the ground level and the n-type source region 11m. The n-type source region 11m, the n-type drain region 11n, the gate insulating layer and the common gate electrode 14c as a whole constitute an n-channel enhancement type field effect transistor of the inverter INV1. A conductive line 14e is connected between the p-type drain region 11k and the n-type drain region 11n.

A pair of n-type source/drain regions 11o/11p is further formed on the surface portion assigned to the interrupting circuit 12e, and the n-type source/drain regions 11o/11p are spaced from each other by a channel region covered with a gate insulating layer (not shown). The gate insulating layer is overlain by a gate electrode 14f, and the n-type source/drain regions 11o/11p, the gate insulating layer and the gate electrode 14f form in combination the n-channel enhancement type switching transistor MT12. The n-type source/drain region 11p is connected through a conductive line 14g to the gate electrode 14a of the p-channel enhancement type switching transistor MT11.

The major surface of the p-type semiconductor substrate 11 is covered with an inter-level insulating layer (not shown) as similar to the p-type semiconductor substrate 1, and the shared conductive line Lsb, the positive power supply line 14b, the conductive lines 14d, 14e and 14g, the signal input/output terminal 13a and the power supply terminal 13b are formed on the inter-level insulating layer.

The interrupting circuit 12e occupies the surface portion, and the surface portion is negligible rather than a discharging line separated from a potential line for the potential level of the p-type semiconductor substrate 11. For this reason, the interrupting circuit 12e is effective against the damage of the gate insulating layer during the fabrication process without increase of the occupation area.

Although a particular embodiment of the present invention has been shown and described, it will be obvious to those skilled in the art that various changes and modifications may be made without departing from the spirit and scope of the present invention.

For example, the n-channel enhancement type switching transistor MT12 may be gated by another kind of logic circuit such as, for example, a NAND gate or a NOR gate.

Only a p-channel enhancement type field effect transistor may form the inverter INV1.

The shared conductive line Lsb may be connected only through a diode to the power supply terminal 13b.

Finally, the interrupting circuit 12e may block the detecting circuit 12d from static electric charge when the static electric charge is applied to the terminals.

What is claimed is:

1. A semiconductor integrated circuit device fabricated on a semiconductor substrate, comprising:

a main electric circuit;

at least one first terminal assigned to an electric signal swinging a potential level thereof within a certain potential range, and supplying said electric signal to said main electric circuit;

at least one second terminal assigned to a power voltage so as to supply said power voltage to said main electric circuit;

a first protective circuit connected to said at least one first terminal, and turned off in so far as said at least one first terminal swings a potential level thereof within said certain potential range;

a second protective circuit connected to said at least one second terminal, and allowing an electric current to flow into said at least one second terminal;

a detecting circuit monitoring a potential level of said semiconductor substrate, and supplying a detecting signal to said main electric circuit when said potential level of said semiconductor substrate reaches a certain value;

a conductive line shared between said first protective circuit, said second protective circuit and said detecting circuit, and propagating an excess potential level from said first protective circuit to said second protective circuit and said potential level of said semiconductor substrate to said detecting circuit; and an interrupting circuit connected between said conductive line and said detecting circuit, and discriminating a safety condition for transferring said potential level of said semiconductor substrate through a current path thereof to said detecting circuit, said interrupting circuit further discriminating a dangerous condition so as to cut off said current path between said conductive line and said detecting circuit.

2. The semiconductor integrated circuit device as set forth in claim 1, in which said interrupting circuit decides said semiconductor integrated circuit device to be in said safety condition when said power voltage is supplied from the outside of said semiconductor integrated circuit device to said at least one second terminal and to be in said dangerous condition when said power voltage is removed from said at least one second terminal.

3. The semiconductor integrated circuit device as set forth in claim 1, in which said interrupting circuit includes a logic circuit for discriminating said safety condition from said dangerous condition and a switching transistor gated by said logic circuit for providing said current path.

4. The semiconductor integrated circuit device as set forth in claim 3, in which said logic circuit is an inverter.

* * * * *